United States Patent [19]

Duhamel et al.

[11] Patent Number: 5,363,096
[45] Date of Patent: Nov. 8, 1994

[54] METHOD AND APPARATUS FOR ENCODING-DECODING A DIGITAL SIGNAL

[75] Inventors: Pierre Duhamel, Issy les Moulineaux; Yannick Mahieux, Begard, both of France

[73] Assignee: France Telecom, Paris, France

[21] Appl. No.: 871,543

[22] Filed: Apr. 21, 1992

[30] Foreign Application Priority Data

Apr. 24, 1991 [FR] France .................. 91 05064

[51] Int. Cl.[5] ............................................. H03M 7/00
[52] U.S. Cl. ...................................... 341/50; 341/51
[58] Field of Search .................... 341/50, 54, 63, 70, 341/71, 72, 75, 51

[56] References Cited

PUBLICATIONS

D. Reynolds et al., "Analysis/Synthesis Image Coding System Based on Time Domain Aliasing Cancellation", Proceedings of the Southeastcon 1989–Energy and Information Technologies in the Southeast, vol. 2, pp. 866–870, 1989.
A. Johnson et al., "Adaptive Transform Coding Incorporating Time Domain Aliasing Cancellation", Speech Communication, vol. 6, No. 4, pp. 299–308, Dec. 1987.
J. Princen et al., "Subband/Transform Coding Using Filter Bank Designs Based on Time Domain Aliasing Cancellation", Proceedings of 12th International Conference on Acoustics, Speech, and Signal Processing, vol. 4, pp. 2161–2164, Apr. 1987.
J. Princen et al., "Analysis/Synthesis Filter Bank Design Based on Time Domain Aliasing Cancellation", IEEE Transactions on Acoustics, Speech and Signal Processing, vol. 34, No. 5, pp. 1153–1161, Oct. 1986.
P. Duhamel, "Implementation of Split-Radix FFT Algorithms for Complex, Real and Real-Symmetric Data", IEEE Transactions on Acoustics, Speech and Signal Processing, vol. 34, No. 2, pp. 285–295, Apr. 1986.
P. Dunhamel, "Algorithms Meeting the Lower Bound on the Multiplicative Complexity of Length 2n DFT's and Their Connection with Practical Algorithms", IEEE Transactions on Acoustics, Speech and Signal Processing, vol. 38, No. 9, pp. 1504–1511, Sep. 1990.

*Primary Examiner*—Sharon D. Logan
*Attorney, Agent, or Firm*—Larson & Taylor

[57] ABSTRACT

After a windowing operation h(n) performed by space-time weighting of the samples, a method and an apparatus for encoding-decoding a digital signal comprising a sequence of samples x(n) consists in performing a modified discrete cosine transform of the samples to calculate the even order transformation coefficients:

$$Y2k = \sum_{n=0}^{N-1} yn \cdot \cos(2\pi/(4N) \cdot (2n + 1) \cdot (4k + 1) + (4 + 1) \cdot \pi/4)$$

for $k \in [0, \ldots, N/2-1]$ with $Y_{N-k} = -Y_{k-1}$ The coefficient $Y_{2k}$ are expressed in the form of an invertible complex transformation:

$$Y2k + N/4 + jY2k = (-1)^{k+1} \cdot W8^{-1} \cdot \sum_{n=0}^{N/4-1} ((y'n - y''n + N/4) + j(y''n + y'n + N/4)) \cdot W4N^{(4k+1)(4n+1)}$$

for $k = 0, \ldots, N/4-1$ with $y'n = x2n \cdot h2n$
$y''n\ xN-2n-1 \cdot hN-2N-1$
$W4N = \cos(2\pi/4N) + j \cdot \sin(2\pi/4N)$ The invertible comples transformation is calculated using an auxiliary calculation equation:

$$Zk = (-1)^{k+1} \cdot W8^{-1} \cdot W4N^{4k+1} \cdot \sum_{n=0}^{N/4-1} (zn \cdot WN^n) \cdot WN/4^{nk}$$

with: $zn = (y2n - yN/2 - 1 - 2n) + j(yN - 1 - 2n + yN/2 + 2n)$
The invention is applicable to encoding and decoding digital audio or video signals.

16 Claims, 7 Drawing Sheets

METHOD AND APPARATUS FOR ENCODING-DECODING A DIGITAL SIGNAL

FIELD OF THE INVENTION

The invention relates to a method and to apparatus for encoding-decoding a digital signal for the purpose of reducing the bit rate it requires for transmission or the space it requires for storage.

BACKGROUND ART

One of the highest-performance encoding-decoding techniques known at present is frequency transform coding. In coders of that type, the digital signal is initially subjected to time-frequency transformation and it is the coefficients of the frequency transform which are encoded and transmitted.

For identical transmitted signal quality, the saving in transmission rate depends on the choice of transformation used for encoding, with the inverse transformation being performed on decoding. Thus, a modified discrete cosine transform (MDCT) based on time domain aliasing cancellation (TDAC, i.e. eliminating distortion in the time domain), is particularly effective compared with conventional transforms such as the discrete Fourier transform (DFT) or the discrete cosine transform (DCT). For a comparison of the relative performance of these types of processing, reference may be made to the article "Analysis/synthesis filter bank design based on time domain aliasing cancellation" published by J. P. Princen and A. B. Bradley in IEEE Transactions on ASSP, Vol. 34, pp. 1153-1161, October 1986.

When compared with encoding techniques using banks of filters, that technique of processing and encoding appears to be much more robust. Furthermore, although the above-mentioned encoding technique does not appear to be significantly better for relatively low compression ratios (e.g. for a high quality digital audio signal whose data rate is reduced to 128 kbits/s instead of a higher bit rate), use thereof would appear to be practically inevitable at much greater compression ratios. However, under such circumstances, such compression performance gives rise to increased complexity.

To enable coding algorithms that use MDCT to operate in real time, i.e. to enable corresponding dedicated coding processors to be implemented ruder satisfactory conditions of cost and reliability in operation, it is essential to establish a fast coding and calculation method for said transform, in order to significantly facilitate not only installation and implementation, but also real time operation of the abovementioned processors.

In the above-mentioned method described by Princen and Bradley, the transform coefficients are defined by:

$$y(m,k) = \sum_{n=0}^{N-1} xm(n) \cdot h(N - 1 - n) \cdot \cos(2\pi \cdot (k + 1/2)(n + N_0)/N) \quad (1)$$

with $k = 0 \ldots, N-1$. In that equation, N is the size or number of samples $x(n)$ in the transform block, $h(n)$ is the block weighting window obtained by space or time weighting, m is the number of the transformation block, and $xm(n)$ indicates the n-th signal sample in the m-th block under consideration. The phase shift $N_o$ is required for perfect reconstruction of the original signal.

Because of the relationship $y(k-1) = -y(N-k)$, the number of independent coefficients $y(m,k)$ in the frequency domain is equal to N/2. The inverse transform $MDCT^{-1}$ required for reconstructing or synthesizing the original audio signal cannot therefore deliver the original sequence. Sampling, being imperfect in the frequency domain, gives rise to distortion in the time domain known as "aliasing".

The synthesis can nevertheless be expressed with the aid of a block transform in which consecutive blocks overlap. For signal synthesis of block mo, the n-th sample of the reconstituted audio signal $x'mo(n)$ is written:

$$x'mo(n) = f(n+N/2).Xmo-1(n+N/2) + f(n).Xmo(n)$$

for $n = 0 \ldots, N/2-1$.

In the above equation, $f(n)$ is the synthesis window and $Xmo(n)$ is the inverse transform of the transform coefficient $y(mo,k)$, i.e.: $Xmo(n) = MDCT^{-1}y(mo,k)$, i.e.:

$$Xm(n) = (1/N) \sum_{n=0}^{N-1} y(m,k) \cdot \cos(2\pi \cdot (k + 1/2)(n + N_0)/N) \quad (2)$$

The original signal is accurately reconstructed, $x'mo(n) = xmo(n)$ by imposing conditions on the analysis window $h(n)$ and on the synthesis window $f(n)$, and also on the phase shift term $N_o$.

Thus, the aliasing terms from one block to another have the same modulus and opposite sign, and therefore cancel, providing the analysis and synthesis windows $h(n)$ and $f(n)$ are identical, of equal length, symmetrical about N/2 and satisfy the following equations:

$$f(n+N/2).h(n) - f(n).h(N/2+n) = 0 \quad (3)$$

$$f^2(n+N/2) + f^2(n) = 2 \quad (4)$$

for $n = 0, \ldots, N/2-1$ $$no = N/4 + 1/2 \quad (5)$$

For example, the following analysis and synthesis windows have a 50% inter-block overlap and satisfy the above conditions:

$$h(n) = f(n) = \sqrt{2} \sin(\pi \cdot (n + 1/2)/N) \quad (6)$$

for $n = 0, \ldots, N-1$.

The main advantage of MDCT lies in the fact that it is possible to use the above-mentioned high-performance windows in the frequency domain without reducing the bit-rate available per coefficient to be encoded. MDCP in association with the above-mentioned windows ensures proper separation of the signal components and thus provides better energy concentration. This improvement in the spectrum representation also facilitates taking account of perceptual phenomena because of the major reduction in spectrum spread, which is not the case when a rectangular window is used, for example.

The MDCT defined above in equation (1) can be calculated by means of a fast Fourier transform (FFT) of the same size, with the above-mentioned MDCT being written:

$$y(m,k) = \quad (7)$$

-continued $$Re\left[e^{j2\pi(k+1/2)no/N} \cdot \sum_{n=0}^{N-1} xm(n) \cdot h(N-1-n) \cdot e^{j2\pi(k+1/2)n}\right]$$

where Re[...] designates the real portion of the complex expression between brackets, i.e.:

$$y(m,k) = Re[e^{j2\pi(k+1/2)no/N} \cdot DFT(xm(n) \cdot h(N-l-n) \cdot e^{j\pi n/N}] \quad (8)$$

It will nevertheless be observed that direct application of above equation (8) requires the following number of calculation operations:

calculation of $x(n) \cdot e^{j\pi n/N}$, i.e. N real and imaginary products;

an FFT of length N; and calculation of the real portion of the term-by-term product of two complex vectors of length N. For $N=2^P$ and for the most efficient calculation algorithm presently known such as that described in the article "Implementation of split Radix FFT algorithms for complex, real and real symmetric data" by Pierre Duhamel, published in IEEE on ASSP, Vol. 34, pp. 285-295, April 1986, calculating equation (8) requires $2N+N \cdot (p-3+4)+2N$ multiplications and $3N(p-1)+4+N$ additions, i.e. a total of $N(4p-1)+8$ operations, ignoring the space-time weighting operations required for the windowing. These numbers which are large when the size of the transform blocks is large, e.g. $N=1024$ for encoding-decoding a digital audio signal, can penalize the use of MEET in an encoding-decoding method for use in real time.

SUMMARY

An object of the method and apparatus for encoding-decoding a digital signal (x) represented by digital samples x(n) of the present invention is to remedy the above-mentioned drawbacks.

Another object of the present invention is to implement a method and apparatus for encoding-decoding a digital signal in which the number of operations required for encoding is substantially reduced.

Another object of the present invention is to implement a method of encoding-decoding a digital signal which, because of the simplification in the processing procedure, makes it possible for such a processing procedure to be installed in a dedicated processor under conditions of cost and reliability that are compatible with real time operation.

The method of the invention for encoding a digital signal(s) represented by digital samples x(n) is applied to samples lumped together in blocks of N successive samples.

Said method is remarkable in that following a windowing operation consisting in space or time weighting of the samples as a function of the position n of each sample in the block, $y(n)=x(n) \cdot h(N-l-n)$ where $h(N-l-n)$ represents a determined weighting law, a modified discrete cosine transform (MDCT) is performed at sample block level to calculate the even order coefficients of the following transformation:

$$Y2k = \qquad (9)$$

$$\sum_{n=0}^{N-1} yn \cdot \cos(2\pi/(4N) \cdot (2n+1) \cdot (4k+1) + (4k+1) \cdot \pi/4)$$

for $k \in [0, \ldots, N/2-1]$ with $YN-k=-Yk-l$ the phase shift term being distributed as a function of the order k of the above-mentioned coefficient. The calculated even order transformation coefficients Y2k are expressed in the form of an invertible complex transformation:

$$Y2k + N/4 + jY2k = \qquad (10)$$

$$(-1)^{k+1} \cdot W8^{-1} \cdot \sum_{n=0}^{N/4-1} ((y'n - y''n + N/4) +$$

$$j(y''n + y'n + N/4)) \cdot W4N^{(4k+1)(4n+1)}$$

for $k=0, \ldots, N/4-l$ with $y'n=x2n \cdot h2n$
$y''n \ xN-2n-l \cdot hN-2N-l$
$W4N=\cos(2\pi/4N)+j \cdot \sin(2\pi/4N)$
$W8=W4N$ for $N=2$ The above invertible complex transformation is then calculated using the auxiliary calculation equation $$Zk = (-1)^{k+1} \cdot W8^{-1} \cdot W4N^{4k+1} \cdot \sum_{n=0}^{N/4-1} (zn \cdot WN^n) \cdot WN/4^{nk} \qquad (11)$$

where:

$$zn = (y2n-yN/2-l-2n) + j(yN-l-2n+yN/2+2n) \qquad (12)$$

and $WN=\cos(2\pi/N)+j \cdot \sin(2\pi/N)$

The apparatus for encoding a digital signal (x) represented by digital samples x(n) lumped in blocks of N successive samples is remarkable in that it comprises first and second input memories each enabling N/2 successive samples to be stored, the second input memory serving to store samples that are delayed by N/2. Following a windowing operation on said samples, which law consists in space sampling the samples $yn=x(n) \cdot h(N-l-n)$ where h (N-l-n) represents a determined weighting law, a calculation circuit makes it possible to perform a modified discrete cosine transform MDCT so as to calculate the even order transform coefficients of the form:

$$Y2k =$$

$$\sum_{n=0}^{N-1} yn \cdot \cos(2\pi/(4N) \cdot (2n+1) \cdot (4k+1) + (4k+1) \cdot \pi/4)$$

for $k\delta[0, \ldots N/2-1]$ with $YN-k=-Yk-l$ the phase shift term being distributed as a function of the order k of the coefficient under consideration, using an invertible complex transformation $$Y2k+N/4+jY2k$$

from an auxiliary calculation equation $$Zk = (-1)^{k+1} \cdot W8^{-1} \cdot W4N^{4k+1} \cdot \sum_{n=0}^{N/4-1} (zn \cdot WN^n) \cdot WN/4^{nk}$$

where:

$$zn=(y2n-yN/2-2n)+j(yN-l-2n+yN/2+2n)$$

for $n=0, \ldots, N/4-l$.

The method and the apparatus for decoding a digital signal x represented by digital samples x(n), said samples being lumped in blocks of N samples and being encoded by the coding method of the invention consists in or allows, in succession: permutating the real portions $Y_{N/4+2k}$ and the imaginary portions $Y_{2k}$ of the transmitted transformation coefficients, subjecting the permutated coefficients to an encoding processing procedure by calculating the complex portion of the forward MDCT, of the form Re[Zk], Im[Zk], in permutating the real and imaginary portions of the complex portion, and then in performing an overlap calculation to reconstitute the samples x(n).

The method and apparatus of the present invention are suitable for use in reducing the bit-rate required for transmission or the space required for storage of digital audio or video signals.

BRIEF DESCRIPTION OF THE DRAWINGS

A more detailed description is given below in a description that refers to the drawings, in which:

FIG. 5b shows a detail of the embodiment of FIG. 5a; and

DETAILED DESCRIPTION OF THE PREFERRED EMBODIMENTS

The method of the invention is initially described with respect to encoding a digital signal x represented by digital samples x(n).

The samples are lumped together in blocks of N successive samples.

Figure 1:
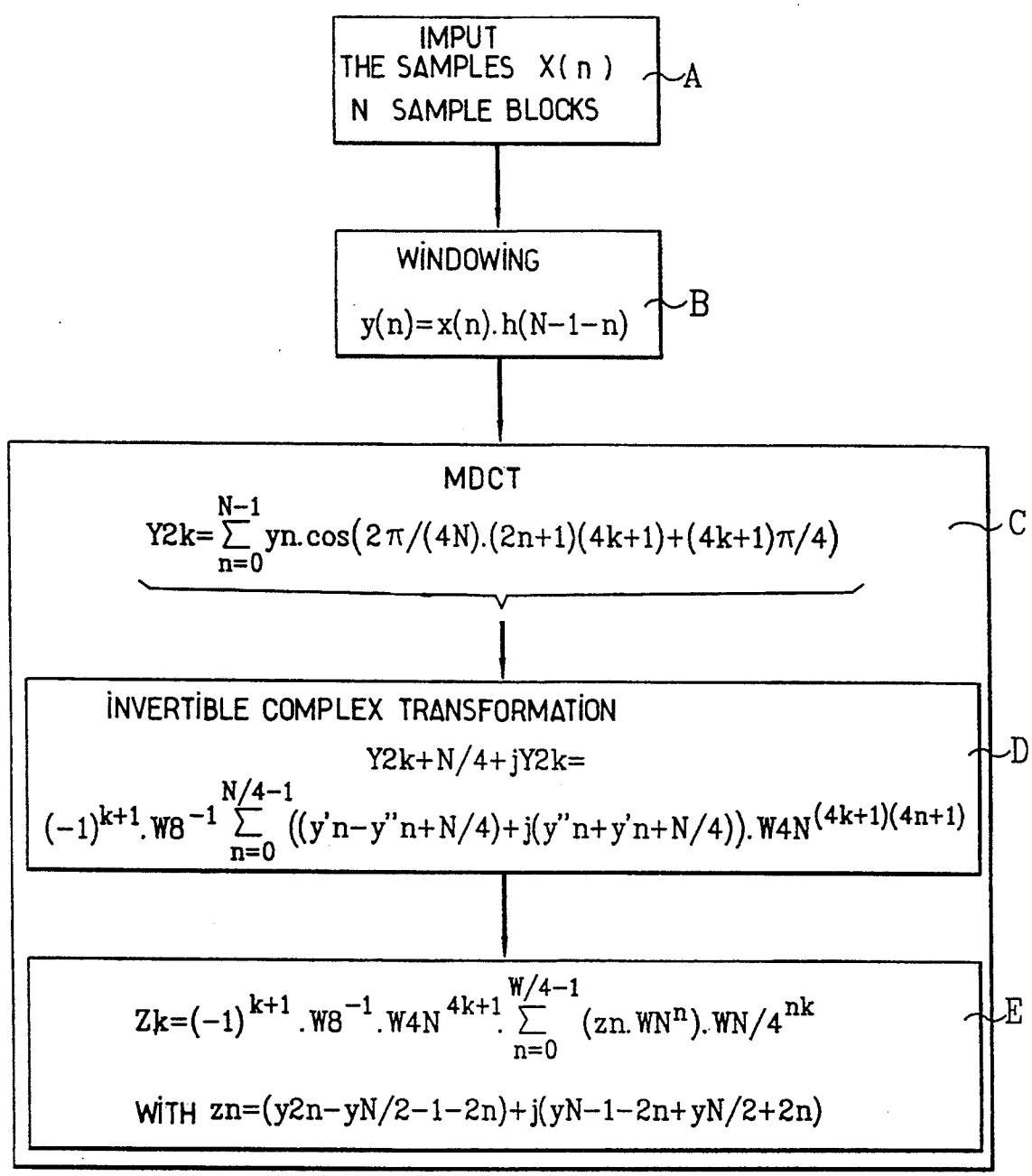
FIG. 1 is a general flow chart showing how the method of the invention is implemented for encoding.

In conventional manner, the encoding method of the invention, as shown in FIG. 1, consists initially in performing a windowing operation by space or time weighting of the samples as a function of sample position n within the block under consideration.

In FIG. 1, a first step marked A consists in an operation of inputting the samples of a block of N samples under consideration, said inputting operation corresponding substantially to storing the samples under consideration under special conditions that are described below.

Above step A is followed by a step B consisting in the above-mentioned windowing operation for converting each sample x(n) into a weighted sample written:

$$y_n = x(n) \cdot h(N-l-n)$$

In the above equation, h(N-l-n) represents a determined weighting law. Naturally, said weighting law satisfies the above-specified conditions, and said weighting law may have the form specified in above equation (6).

As represented by operation C in FIG. 1, the encoding method of the invention then consists in performing a modified discrete cosine transform MDCT on the blocks of samples, essentially on the weighted samples obtained from step B, to calculate the even order coefficients of the transformation of the form:

$$Y_{2k} = \sum_{n=0}^{N-1} y_n \cdot \cos(2\pi/(4N)) \cdot (2n+1) \cdot (4k+1) + (4k+1) \cdot \pi/4)$$

In an advantageous aspect of the method of the invention, the above even order transformation is calculated for:

$$k\delta[0, \ldots, N/2\text{-}l]$$

It is necessary to calculate the even terms only because of antisymmetry:

$$k\delta[0, \ldots, N/2\text{-}l]$$

with $$Y_{N-k} = -Y_{k-l}$$

It may be observed in above equation (2) that the phase shift term is distributed as a function of the position k of the transformation coefficient under consideration.

In a particularly advantageous aspect of the encoding method of the present invention, the above-mentioned even order transformation coefficients are expressed in the form of an invertible complex transformation at step D in FIG. 1.

This invertible complex transformation satisfies the equation:

$$Y_{2k} + N/4 + jY_{2k} = (-1)^{k+1} \cdot W_8^{-1} \cdot \sum_{n=0}^{N/4-1} ((y'_n - y''_n + N/4) + j(y''_n + y'_n + N/4)) \cdot W_{4N}^{(4k+1)(4n+1)}$$

The above equation is calculated for $$k = 0 \ldots N/4\text{-}L$$

In this equation, the following expressions have the values given below:

$$y'_n = x_{2n} \cdot h_{2n}$$

$$y''_n = x_{N-2n-L} \cdot h_{N-2n-l}$$

$$W_{4N} = \cos(2\pi/4N) + j \cdot \sin(2\pi/4N)$$

It should be observed, in particular, that the expression W4N designates the 4N-th root of unity.

As also shown in FIG. 1, the above invertible complex transformation is calculated using the following auxiliary calculation equation:

$$Zk = (-1)^{k+1} \cdot W8^{-1} \cdot W4N^{4k+1} \cdot \sum_{n=0}^{N/4-1} (zn \cdot WN^n) \cdot WN/4^{nk}$$

In which the term zn designates:

$$zn = (y2n \cdot yN/2 \cdot l \cdot 2n) + j(yN \cdot l \cdot 2n + yN/2 + 2n)$$

With said equation likewise being calculated for $n=0, N/4-1$.

In general, it is considered that in a particularly advantageous aspect of the encoding method of the present invention, the invertible complex transformation as established at step D of FIG. 1 can then be calculated very efficiently in the following step E using the above equation.

A particularly advantageous calculation procedure for calculation steps E and D as described above with reference to FIG. 1 is described below in greater detail with reference to FIG. 2.

Figure 2:
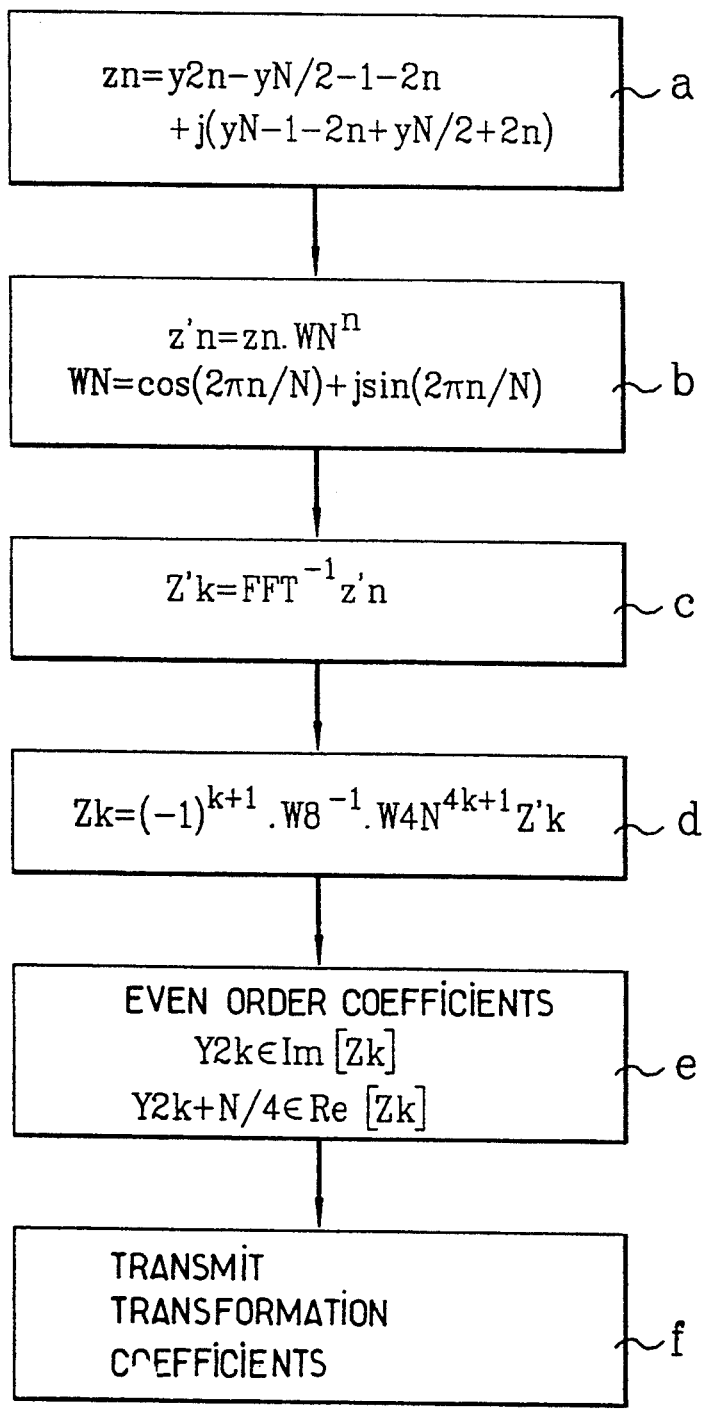
FIG. 2 is a flow chart of a particularly advantageous but non-limiting implementation of the essential steps in the implementation of FIG. 1.

In FIG. 2, the above-mentioned invertible complex transformation is calculated by the following successive steps:

step a: calculate zn using equation $$\text{for } n=0 \ldots, N/4-1; \quad (12)$$

i.e. at an effective cost of N/2 real additions step b: calculate $$z'n = zn \cdot WN^n \text{ for } n=0 \ldots, N/4-1 \quad (13)$$

which step requires N/4-1 complex multiplications, since the expression $WN^n$ satisfies the equation:

$$WN^n = \cos\left(2\pi \frac{n}{N}\right) + j \cdot \sin\left(2\pi \frac{n}{N}\right)$$

step c: inverse fast Fourier transform on the variable z'n obtained above in step b to obtain:

$$Z'k = FFT^{-1}z'n \quad (14)$$

It may be observed that the fast Fourier transform is a Fourier transform of size N/4, with such an operation making use of known processing techniques.

Step c is then followed by step d, as shown in FIG. 2, which consists in calculating the equation:

$$zk = ((-1)^{k+1} \cdot W8^{-1} \cdot W4N^{4k+1} \cdot Z'k) \quad (15)$$

for $k=0 \ldots, N/4-1$.

In the above equation, it should be observed that W8 designates the 8-th root of unity, and that $W4N^{4k+1}$ designates the 4N-th root of unity raised to the power $4k+1$.

The above equation is calculated for $k=0, \ldots, N/4-1$.

step e: successively determining the even order transformation coefficients given by the following equations:

$$Y2k\delta Im[Zk] \text{ imaginary portion of } Zk \quad (16)$$

$$Y2k + N/4\delta Re[Zk] \text{ real portion of } Zk \quad (17)$$

It will thus be observed that the even order coefficients are given by the imaginary portion and by the real portion of the above-mentioned equation Zk.

step f: transmitting the transformation coefficients obtained above at step e instead of the digital samples x(n) constituting the digital signal. This transmission is performed by transmission in the form of an encoded signal.

It may be observed that an identical step for determining the odd order transformation coefficients after the even order coefficients have been determined is not necessary since said odd coefficients are given by the antisymmetry relationship based on the even order coefficients:

$$Y2K+l = -Y2k \quad (18)$$

$$Y2k+l+N/4 = -Y2k+N/4 \quad (19)$$

In order to perform step c of the fast Fourier transform calculation, it is preferable to use the calculation method described by Pierre Duhamel in the publication entitled "Implementation of Split-Radix FFT algorithms for complex real and real symmetric data" specified above in the introduction to the description.

Under such circumstances, the number of calculation operations required for performing the encoding method of the present invention can be evaluated as follows:

total number of multiplications:

N/4(q+1) real multiplications with N=2q; and total number of additions:

N/4(3q-1) real additions.

Adding together the total number of real operations, it can be seen that the minimum total number of operations required for implementing the encoding method of the present invention is exactly equal to N.q. In evaluating the above number of operations, it has been assumed in conventional manner that in terms of calculation difficulty, a complex multiplication is equivalent to three real multiplications plus three real additions.

It would also be possible to evaluate equivalence using four real multiplications and two real additions, but that gives rise to equations that are much more complicated. In any event the total number of operations N.q remains unchanged. The encoding method of the present invention thus provides an improvement by a factor of 4 relative to the prior art encoding method described in the introduction to the description of the present patent application.

In particular, it may be observed that the above-defined term for calculation difficulty is compatible with the best FFT coding methods. The relationship between this type of FFT coding process and equations (11) and (12) defining the expression Zk given in step E of the coding method of the present invention are bilateral and one-to-one. In an article entitled "Algorithms meeting the lower bound on the multiplicative complexity of length 2n DFT's and their connection with practical algorithms" published in the journal IEEE trans on ASSP, Vol. 38, pp. 1504–1511, in September 1990, the same author Pierre Duhamel has shown that the active portion of a split radix type fast Fourier transform corresponding to size N is indeed given by the above-mentioned equation of size N/16, and that consequently said active portion can be calculated using the principles explained above, except, perhaps, for constants such as $W8^{-1}$ and $(-1)^{k+1}$, for example.

The term "compatibility" must thus be understood as the fact that the improvement of the processing by the split radix type fast Fourier transform would obtain a better modified discrete cosine transform (MDCT) process, but the improvement of the modified discrete cosine transform (MDCT) process as proposed in the coding method of the present invention also provides a better way of processing using the fast Fourier transform (FFT) than those presently known.

Consequently, the method of the present invention is better in terms of number of operations, i.e. real multiplications and additions, than methods proposed in the present state of the art on this type of processing.

In the implementation of the coding process shown in FIG. 2, it is possible to modify above-described steps b and d by taking multiplication by $W8^{-1}$ from step d and including it in above-mentioned step b. Such an operation changes the symmetries in the sine and cosine tables, i.e. tables of values required for implementing the coding method of the present invention.

Including multiplication by $W8^{-1}$ in step b changes the symmetries of the corresponding memory tables. It should nevertheless be observed that utilization of said tables can then be facilitated.

In addition, with the equation for the auxiliary calculation of Zk being expressed in the form:

$$Zk = (-1)^{k+1} \cdot W8^{-1} \cdot WN^k \cdot \sum_{n=0}^{N/4-1} (zn \cdot W4N)^{(4n+1)} \cdot WN/4^{nk}) \quad (12b)$$

steps b and d of FIG. 2 can be interchanged. Complex multiplications by $W4N^{(4n+l)}$ are then placed at the beginning or at the end of the calculation, which end is chosen is determined as a function of minimum calculation time.

A method of decoding a digital signal x represented by digital samples x(n) lumped into blocks and encoded using the above-described encoding method is now described with reference to FIG. 3.

Figure 3:
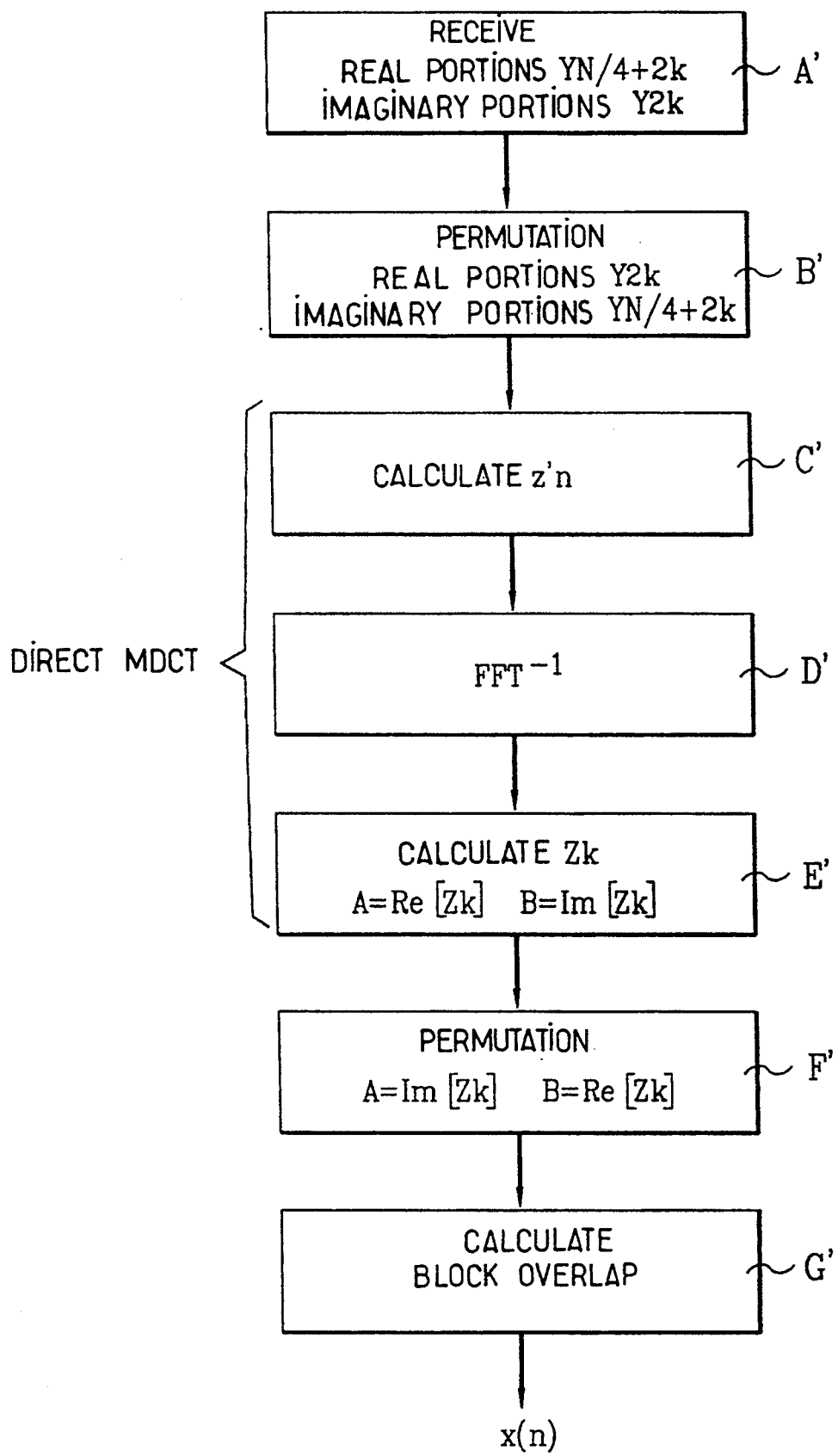
FIG. 3 is a flow chart of an implementation of the method of the invention, at decoding level.

In FIG. 3, following a step A' in which the previously transmitted real and imaginary portions YN/4+2k and Y2k are received after being encoded by the method of the invention, the decoding method consists in a step B' in permutating the real and imaginary portions YN/4+2k and Y2k of the transmitted transformation coefficients.

In a particularly advantageous aspect of the encoding and decoding method of the present invention, the method further consists during decoding in a step C' as shown in FIG. 3, where the above-mentioned permutated coefficients are subjected to an encoding process by calculating the complex portion of The operation consisting in subjecting the permutated coefficients to an encoding process by calculating the complex portion of the forward MDCT is justified by the fact that the set of steps b, c, and d as described above with reference to FIG. 2 forms an invertible complex transformation. Consequently, the inverse of the transform constituted by the above-specified steps constitutes the core of an inverse modified discrete cosine transform or inverse MDCT, said MDCT being calculated by means of the corresponding forward MDCT, after the real and imaginary portions of the input signal have been interchanged, such interchanging having the effect for any input signal of complex form z=a+jb of generating an inverted complex signal of form z*=b+ja, thereby generating inverted input signals, after which the forward MDCT is performed on the inverted input signals to generate output signals written Y*k. It will naturally be observed that interchanging the real and imaginary portions of the output signals Y*k makes it possible to generate the inverse output signals Yk, which reduces to permutating the real and imaginary portions of the complex portion of the above-mentioned MDCT.

The decoding method of the present invention is then followed by a step G' in which the block overlap is calculated in order to reconstruct the samples x(n).

In the decoding method of the present invention, the processing constituted by steps C', D', and E' of FIG. 3 where the complex portion of the forward MDCT is performed is identical to the processing performed during encoding and, like the encoding method, comprises the following calculations but performed on the permutated real and imaginary portions as received after transmission: at C', calculating $z'n=zn \cdot WN^n$ for $n=0 \ldots, N/4-1$; at D' calculation using the inverse fast Fourier transform $FFT^{-1}$ of size N/4, i.e. $Z'k=FFT^{-1}.z'n$; then at E', calculating the expression given by the following equation:

$$Zk = ((-1)^{k+l} \cdot W8^{-l} \cdot W4N^{4k+l}) \cdot Z'k \quad (15)$$

for $k=0 \ldots, N/4-1$.

Apparatus for encoding a digital signal in accordance with the present invention is described in greater detail with reference to FIG. 4.

Figure 4:
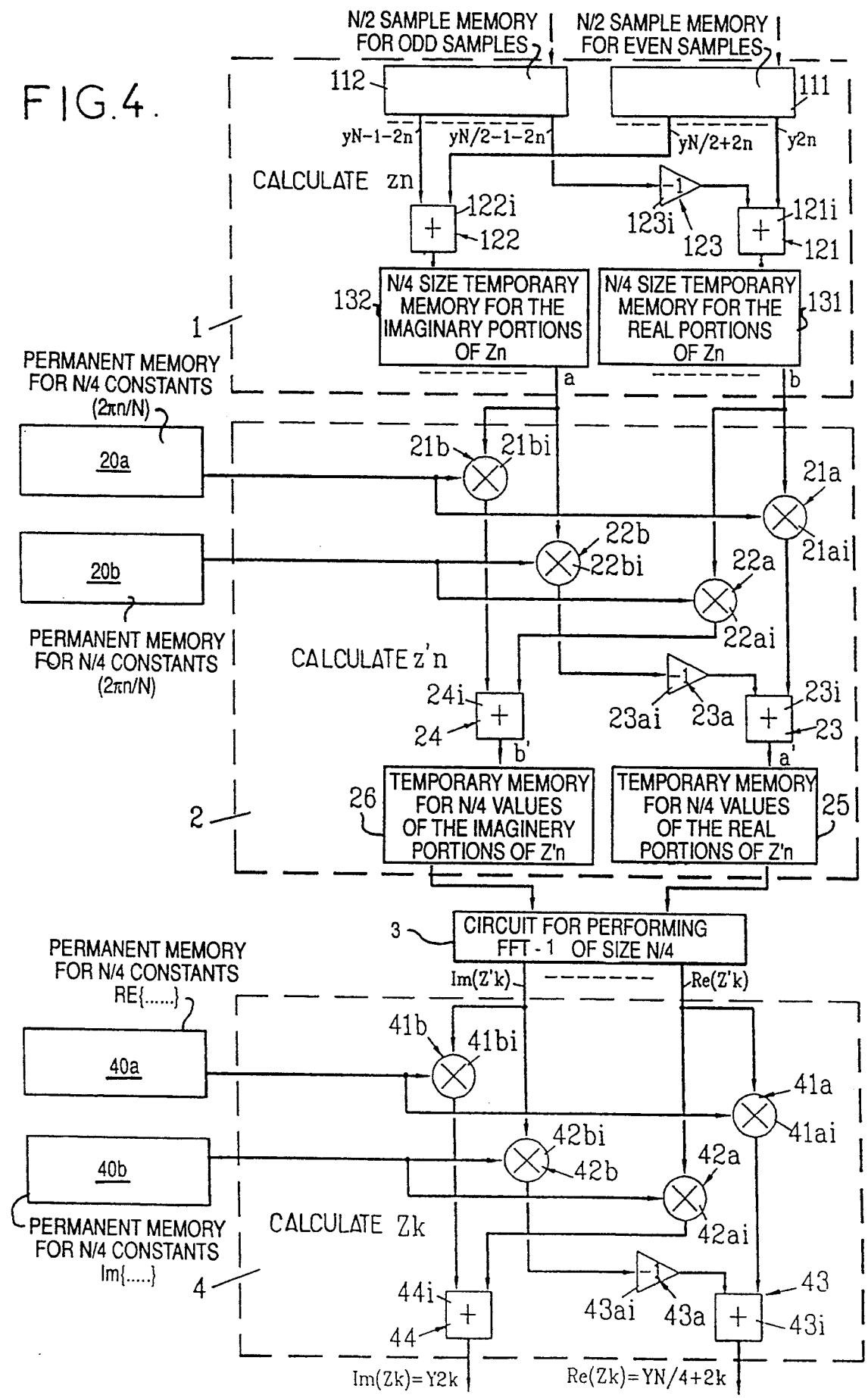
FIG. 4 is a block diagram of one embodiment of apparatus of the present invention for encoding a digital signal.

In FIG. 4, using samples as described above lumped into blocks of N successive samples, the apparatus comprises first and second input memories 111 and 112 each capable of storing N/2 successive samples. By way of non-limiting example, the second input memory 112 serves to store samples delayed by N/2. In another variant embodiment, the first input memory serves to store N/2 even order points or samples by addressing, while the second input memory 112 serves to store N/2 odd order samples or points.

Calculation circuits referenced 1, 2, 3, and 4 in FIG. 4 serve respectively to perform the following:
calculate zn in compliance with equation (12);
calculate z'n satisfying equation (13);
calculate the inverse fast Fourier transform $FFF^{-L}$ of N/4 using equation (14); and
calculate Zk using equation (15).

Naturally, by way of non-limiting example, following the above-mentioned windowing operation constituting space or time weighting of the samples, the calculation circuits 1, 2, 3, and 4 thus perform a modified discrete cosine transform MDCT making it possible, in particular, to establish successively an invertible complex transformation Y2k+N/4+jY2k satisfying equations (16) and (17) using the auxiliary calculation expression.

Thus, the above-mentioned circuits 1, 2, 3, and 4 for calculating the invertible complex transformation comprise in succession and in cascade the encoding apparatus of the present invention, a complex calculation circuit 1 for calculating zn, a complex multiplication circuit 2 for calculating $z'n=zn \cdot WN^n$ for $n=0, \ldots, N/4-1$, an inverse fast Fourier transform calculation circuit 3 for calculating $FFT^{-1}.z'n$, i.e. the expressions Z'k satisfying equation (14), and a third circuit 4 for calculating the expression Zk satisfying equation (15) for $k=0, \ldots, N/4-1$. This third circuit 4 thus serves to determine in succession the even and odd order coefficients of the transformation, as described above.

As shown in FIG. 4, the first complex calculation circuit zn comprises first and second summing circuits referenced 121 and 122, connected to the first and second input memory circuits 111 and 112.

The first summing circuits receive firstly the weighted sample value y2n directly from the first input memory, and secondly the weighted sample value yN/2-1-2n from the second input memory 112 via a multiplier referenced 123 for multiplying by −1. The second summing circuits 122i receive firstly the weighted sample yN/2+2n from the first input memory 111, and secondly the weighted sample yN-1-2n from the second input memory. It will naturally be observed that the first and second summing circuits 121 and 122 may in fact be constituted by elementary summing circuits referenced 121i, 122i, with each elementary summing circuit receiving the above-mentioned pairs of weighted sample values so as to build up the set of complex values zn. Naturally, each first summing circuit 121i is connected to the second input memory 112 via a circuit for multiplying by −1, referenced 123i. Thus, the first summing circuits 121 may be formed by N/2 elementary summing circuits 121i. The same applies to the second summing circuits 122, made up of elementary summing circuits 122i.

The number of elementary components such as the elementary summing circuits 121i and 122i can be determined so as to establish a compromise between processing speed and memory capacity.

Furthermore, the first complex calculation circuit 1 includes first and second auxiliary memories for storing N/4 values, these first and second auxiliary memories referenced 131 and 132 being connected to the outputs of the first and second adding circuits 121 and 122, and in particular to the elementary adding circuits that make them up.

The auxiliary memories 131 and 132 enable the real portion and the imaginary portion respectively of zn to be stored.

In the same manner, and as shown in FIG. 4, the second circuits 2 for complex multiplication to calculate z'n include circuits referenced 20a and 20b for storing constant values, namely the constants $WN^n$. These memory circuits may be constituted by RAM type memory circuits suitable for fast read access, and themselves being loaded from read-only memories (ROM) containing the above-mentioned constant values.

In addition, first multiplier circuits referenced 21a and 22a are provided to receive firstly the real portion a of zn=a+jb, and secondly either the real portion $$\cos 2\pi \frac{n}{N}$$

or the imaginary portion $$\sin 2\pi \frac{n}{N}$$

These first multiplier circuits deliver the products $$a \cdot \cos 2\pi \frac{n}{N} \text{ and } a \cdot \sin 2\pi \frac{n}{N}.$$

In the same way, second multiplier circuits referenced 21b and 22b receive firstly the imaginary portion b of zn, and secondly the real portion $$\cos 2\pi \frac{n}{N}$$

or the imaginary portion $$\sin 2\pi \frac{n}{N}$$

of $WN^n$. These second multiplier circuits 21b and 22b deliver the products $$b \cdot \cos 2\pi \frac{n}{N} \text{ and } b \cdot \sin 2\pi \frac{n}{N}.$$

As also shown in FIG. 4, first summing circuits 23 receive the product $$a \cdot \cos 2\pi \frac{n}{N}$$

from the first multiplier circuit 21a and also the product $$b \cdot \sin 2\pi \frac{n}{N}$$

from the second multiplier 22b via a multiplier by −1 referenced 23a. The first summing circuit 23 thus delivers the real portion of z'n=a'+jb' with $$a' = a \cdot \cos 2\pi \frac{n}{N} - b \cdot \sin 2\pi \frac{n}{N}.$$

Similarly, second summing circuit 24 is provided which receives firstly the product $$a \cdot \sin 2\pi \frac{n}{N}$$

from the first multiplier circuit 22a and secondly the product $$b \cdot \cos 2\pi \frac{n}{N}$$

from the multiplier circuit 21b. This second summing circuit 24 delivers the imaginary portion of zn, $$b' = a \cdot \sin 2\pi \frac{n}{N} + b \cdot \cos 2\pi \frac{n}{N}$$

The notation i in the multiplier circuits and in the summing circuits indicates that there may be a multiplicity of them up to a possible maximum number N/4 under the conditions indicated above.

In addition, first and second auxiliary memories 25 and 26 serve respectively to store the values of the real portion a' and of the imaginary portion b' of z'n. It may be observed that the above-mentioned auxiliary memories are RAM type, memories, each capable of storing N/4 values.

The calculation circuit 3 serves to perform an inverse fast Fourier transform $FFT^{-1}$ of the expression $$Z'k = FFT^{-1} \cdot z'n$$

This may be performed by a dedicated circuit implementing the calculation method described by Pierre Duhamel in the abovementioned article.

Finally, as also shown in FIG. 4, third complex multiplier circuits 4 of the expression Zk may include circuits referenced 40a and 40b for storing the real and imaginary portions of the constants $W8^{-l}$ and $W4N^{4k+l}$. It may be observed that in general the permanent memories for constants such as 20a, 20b, or 40a, 40b are omitted from the drawings of the corresponding calculation circuits in order to avoid overcrowding the drawings.

As can be seen in FIG. 4, the third complex multiplication circuit 4 comprises components analogous to those of the second complex multiplication circuit 2. In particular, it comprises first multiplier circuits 41a and 42a receiving firstly the real portion of the expression Z'k and secondly the real portion and the imaginary portion respectively of the constants $W8^{-1}$ and $W4N^{4k+l}$ from the memory circuits 40a and 40b.

The first multiplier circuits deliver the corresponding products.

In addition, second multiplier circuits 41b and 42b receive firstly the imaginary portion of the expression Z'k and secondly the real portion and the imaginary portion respectively of the constants $W8^{-l}$ and $W4N^{4k+l}$ from the same memory circuits 40a and 40b. They deliver the corresponding products.

In addition, first and second summing circuits 43 and 44 are provided. The first summing circuit 43 receives the product delivered by the first multiplier circuit 41a and the product delivered by the second multiplier circuit 42b via a multiplier by −1 referenced 43a. It delivers the real portion of the expression Zk, such that:

$$Re[Zk] = YN/4 + 2k$$

The second summing circuit 44 receives firstly the product delivered by the first multiplier circuit 42a, and secondly the product delivered by the second multiplier circuit 41b, and it delivers the imaginary portion of the expression Zk:

$$IM[Zk] = Y2k$$

Figure 5A:
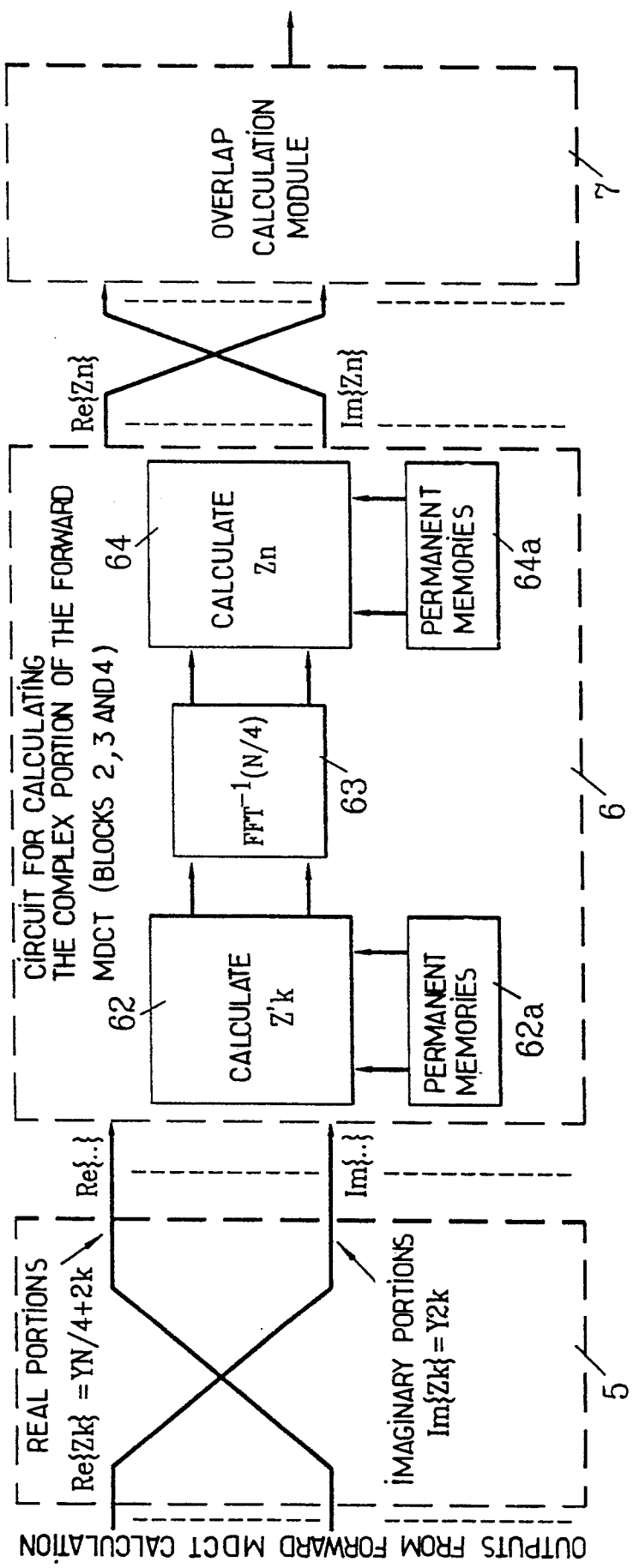
FIG. 5a is a block diagram of apparatus for decoding a digital signal encoded using the encoding apparatus of the invention as shown in FIG. 4.

A more detailed description of apparatus for decoding a digital signal x represented by samples x(n), said samples having been coded using the above-described encoding method, is now given with reference to FIG. 5a.

As shown in FIG. 5a, the decoding apparatus comprises a circuit 5 for storing and reading the transmitted transformation coefficients as established by the encoding circuit of FIG. 4, said coefficients being written:

$$YN/4+2k = Re[Zk] \text{ and } Y2k = Im[Zk]$$

The circuit 5 for storing and reading makes it possible to permutate the transmitted transformation coefficients as stored by appropriate addressing on reading, said permutation being represented in FIG. 5a by crossing over the real and imaginary stored portions.

In addition, the decoding apparatus includes a circuit 6 for calculating the complex portion of the forward MDCT, which circuit includes in cascade: a complex multiplier circuit 62 for calculating Z'k, and a circuit 63 for performing the corresponding inverse Fourier transform $FFT^{-l}$. A circuit 64 serves to calculate the equation Zk:

$$Zk = (-1)^{k+l} \cdot W4N^{4k+l} \cdot Z'k$$

It may be observed that the circuit 6 for calculating the complex portion of the forward MDCT includes modules 62, 63, and 64 which are respectively identical to the modules 2, 3, and 4 of the encoding apparatus. Consequently, these modules are not described in greater detail.

In addition, as shown in FIG. 5a, the decoding apparatus includes, after interchanging or permutating the real and imaginary portions of Zk by read addressing in manner analogous to the permutation performed with the above-described input module 5, a module referenced 7 for calculating overlap and described below.

It will be understood that the module 6 for calculating the complex portion of the forward MDCT by means of abovedescribed modules 62, 63, and 64 in which data is processed in an inverse procedure, finally delivers a complex variable written Zn and having the form:

$$zn = (x2n.h2n-xN/2-2n-l.hN/2-2n-l) \\ +j(xN-2n+l.hN-2n+l-xN/2+2n.hN/2+2n)$$

In this equation, the real portion is delayed by half a block relative to the imaginary portion, i.e. by N/2 samples.

In the above-mentioned equation, it is assumed that the weighting window in the encoding process and the window used in the decoding process are identical.

After compensating for the above-mentioned delay, the above equation can be written in the form:

$$Zn = (x2n+jxN/2-2n+l)(h2n/+jh(N/2+2n))$$

The above-mentioned conditions that enable the original samples to be perfectly reconstructed then enable the sequence of samples x(n) to be reconstructed merely by complex multiplication of the above-mentioned equation for zn by the expression:

$$h2n-jhN/2+2n$$

Figure 5B:
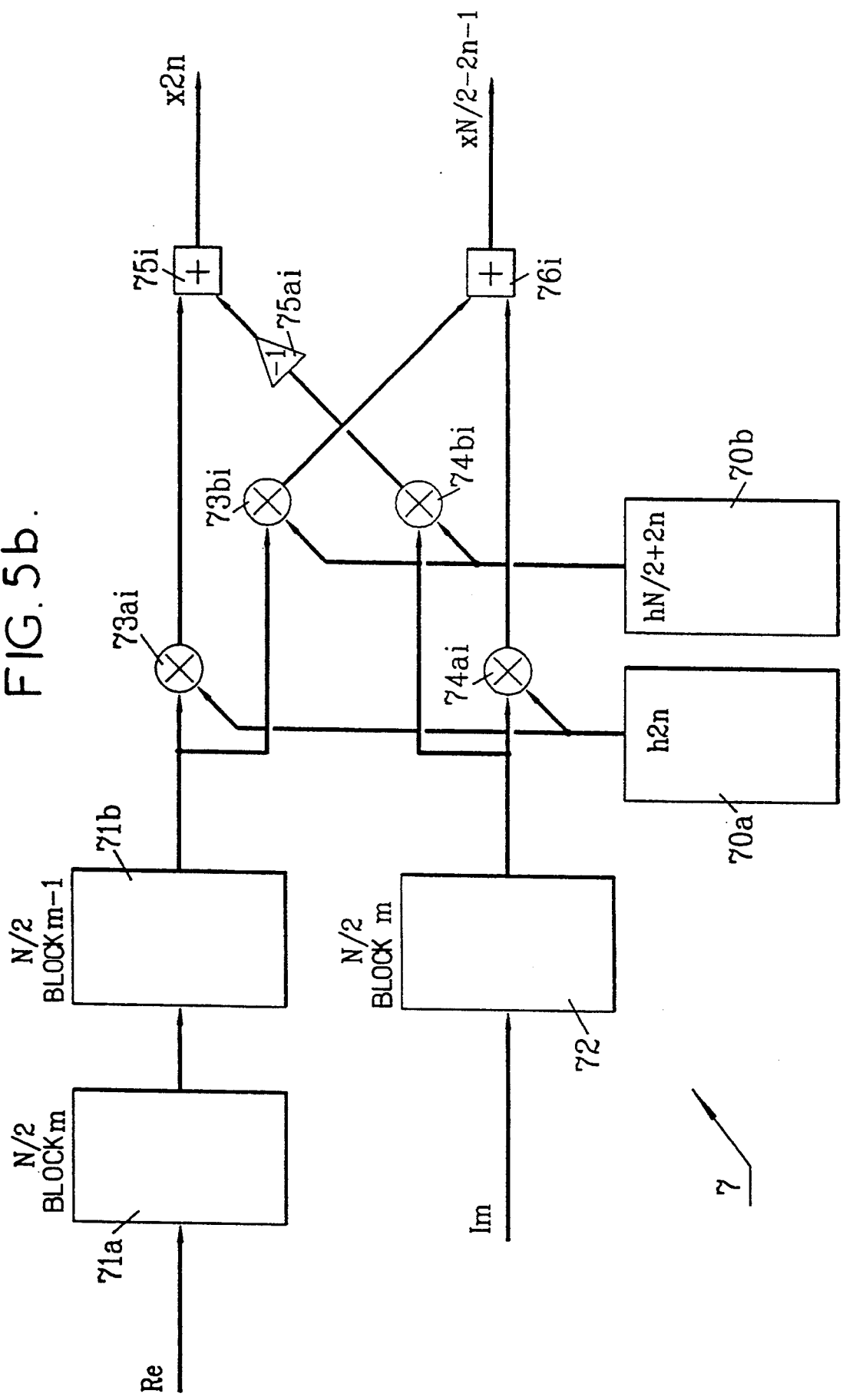

As shown in FIG. 5b, the module 7 for calculating overlap comprises first and second memories 71a and 71b for storing N/2 samples enabling the samples corresponding to blocks m and m-1 respectively to be stored so as to compensate for the N/2 sample delay of the real portion relative to the corresponding imaginary portion in the above-mentioned expression. The N/2 samples of the imaginary portion of block m are stored in a memory 72.

In addition, as described above when describing complex multiplier circuits such as 2 and 4 or 62 and 64, for example, the module 7 for calculating overlap includes multipliers 73ai, 73bi, 74ai, 74bi, a sign inverter 75ai, and two summing circuits 75i and 76i.

The multiplying coefficients h2n and hN/2+2n are stored in memories 70a and 70b. It will naturally be understood that in the embodiment shown in FIG. 5b, the multiplying circuits and the summing circuits of index i are shown merely by way of example so as to avoid overcrowding the drawing, and the number of multiplying circuits and summing circuits may be equal to N/2 so as to perform the corresponding operations on the corresponding stored N/2 values.

The summing circuits 75i and 76i then deliver corresponding reconstituted samples x2n and xN/2-2n-1.

In an improved embodiment for implementing the encoding and decoding method and apparatus of the present invention, said method and apparatus may advantageously enable windowing and overlap to be taken into account directly in the calculation process.

It may be observed firstly that the structure of the calculation process shows that the window enabling perfect reconstruction does in fact perform a rotation of the two sample portions of even rank or odd rank respectively in the sequence of input samples x(n). In addition, with respect to the overlap calculation, when reconstructing samples in the decoder, the property of perfect reconstruction due solely to the N/2 sample overlap between blocks of samples makes it possible after compensating for the N/2 sample delay to obtain the sequence of reconstructed samples x2n by complex multiplication by the expression:

$$h2n - jhN/2 + 2n$$

Using a window such as that defined by equation (6) then makes it possible to simplify the encoding process or the decoding process as the case may be as implemented by the present invention very considerably by taking account of the observation, whereby the operator defined by equation (6) defining the weighting window applied to the samples during the operation of weighting the input samples x(n) or the operation or reconstructing the output samples x2n is none other than the operation of taking the 4N-th root of unity to the power 4n+1, i.e. $W4N^{4n+1}$.

In both the encoding process and the decoding process it can be seen that the equation (15) is obtained by a similar rotation operation applied to the coefficients Z'k obtained after processing 3 using the inverse fast Fourier transform $FFT^{-1}$.

Thus, the windowing 1 and the complex multiplication 2 for calculating z'n in the processing technique with $$c = \cos 2\pi \frac{4n+1}{4N} \text{ and } s = \sin 2\pi \frac{4n+1}{4N}$$

can be expressed by the equation:

$$z'n = ((x2n.c - xN/2 - l - 2n.s) + j.zo^{-N/2}.(x2n.s + xN/2 - 2n - l.c)).(c + js)) \quad (18)$$

i.e.:

$$z'n = zo^{-N/2}.(x2n.s^2 + xN/2 - l - 2n.c^2) \quad (19)$$

the identity $c^2 = 1 - s^2$ makes it possible to deduce:

$$z'n = (x2n - j \cdot xN/2 - 1 - 2n) + \quad (20)$$
$$(-(x2n \cdot s^2 + xN/2 - 2n - 1 \cdot cs) +$$
$$j(x2n \cdot cs + xN/2 - 1 - 2n \cdot c^2)) + zo^{-N/2} \cdot$$
$$((x2n \cdot s^2 + xN/2 - 2n - 1 \cdot cs) + j(x2n \cdot cs +$$
$$xN/2 - 2n - 1 \cdot c^2))$$

In the above equations, it is recalled that $zo^{-N/2}$ represents the N/2 sample delay operator applied to the current order n samples or values.

Thus, the above-mentioned process as described takes account of the special windowing while causing only two new quantities to be included in each block of N samples, namely the quantities $$(x2n.s^2 + xN/2 - 2n - l.cs)$$

and $$(x2n.cs + xN/2 - 2n - l.c^2)$$

Thus, by storing N/4 additional values, it is possible in an embodiment of an encoder or a decoder of the present invention as described with reference to FIG. 6 to reduce the number of operations from 3N as required for said operations comprising two rotations, windowing performed upstream from the process 1 for calculating zn, and the complex multiplication at 2 for calculating z'n in FIG. 4, where said two rotation processes together require 3N operations, to N multiplications and N additions, i.e. to 2N operations, such that the cost in number of operations relating to windowing thus appears to be eliminated.

Figure 6:
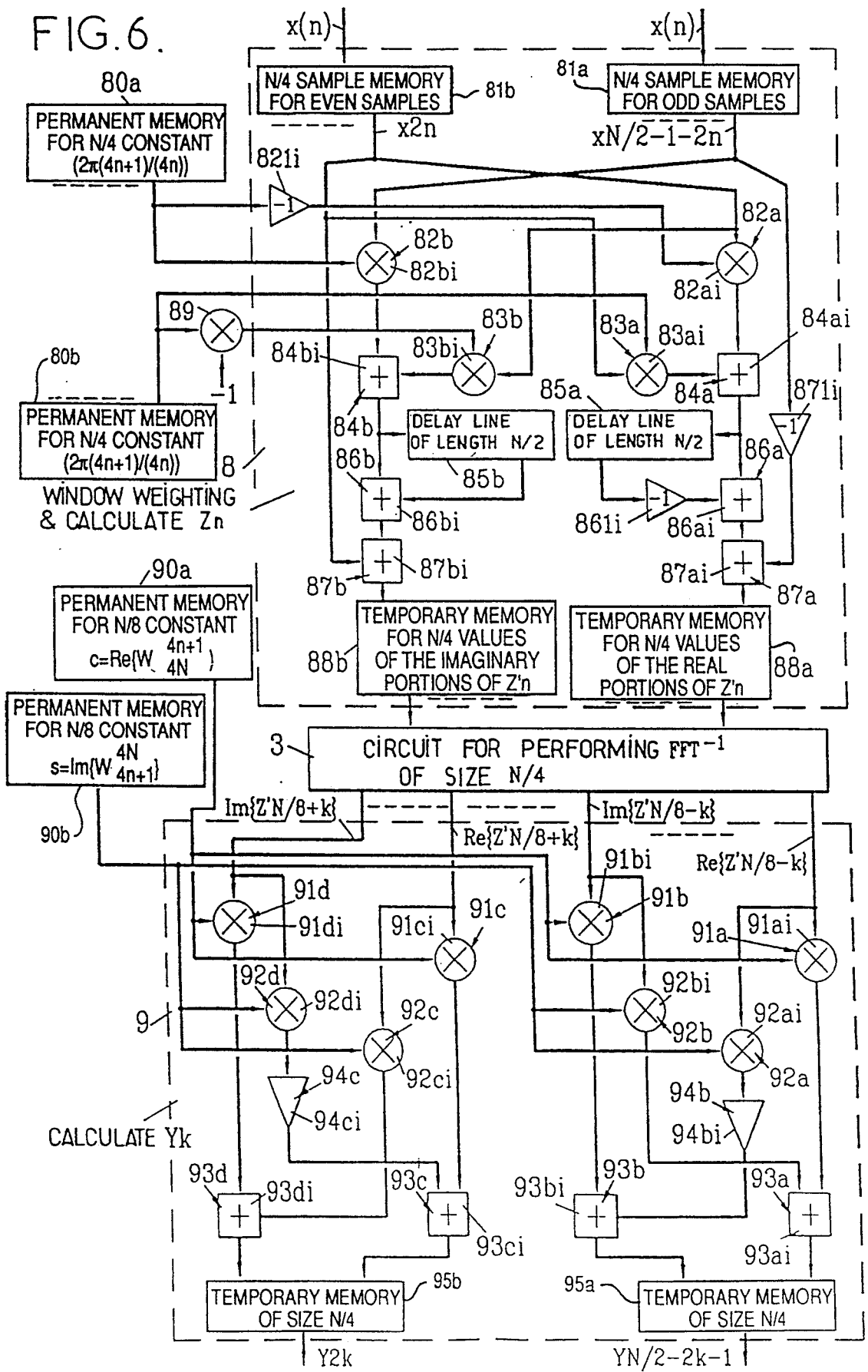
FIG. 6 is a block diagram of an embodiment of apparatus for encoding or decoding, in which the calculation operations relating to windowing or space-time overlap of the samples is integrated in the calculation of a complex product, thereby eliminating the cost (in terms of number of operations) of windowing or overlapping.

It may be observed that in the encoding process as shown in FIG. 6, the apparatus implementing such a process includes a module 8 for windowing and calculating z'n which replaces the windowing module (not shown), the module 1 for calculating zn, and the module 2 for complex multiplication to calculate z'n in FIG. 4. The module 8 is followed by the module 3 for calculating the inverse fast Fourier transform $FFT^{-1}$ of size N/4, which is itself followed by a module 9 for calculating the even coefficients of the transform Y2k and then respective odd coefficients YN/2-2k-1.

FIG. 6 shows the above-mentioned modules 8, 3, and 9 in succession. It may be observed that in application of the above-established convention, any operator (multiplication or summing) is given a general numerical reference which, when associated with an index i, corresponds to an elementary operator with a plurality of such elementary operators serving to build up the above-mentioned operator. Thus, in the modules 8 and 9 of FIG. 6, all of the indices i indicate that there may in fact be a plurality of N/4 corresponding elementary operators, thereby enabling an encoding apparatus or a decoding apparatus to be implemented that is capable of operating in real time with optimized memory capacity.

As shown in FIG. 6, the module 8 for windowing and calculating z'n comprises a first input memory 81a and a second input memory 81b serving to store odd samples and even samples x(n), respectively.

First multipliers 82a and 82b receive respectively the stored samples x2n delivered by the memory 81b and the odd samples xN/2-l-2n delivered by the memory 81a. The abovementioned first multipliers also receive respectively via an auxiliary memory 80a the value of the constant c mentioned above via an inverter 821i and directly.

In addition to receiving the even samples x2n and the odd samples xN/2-l-2n, second multipliers, referenced 83a and 83b, receive the value of the above-mentioned constant s from an auxiliary memory referenced 80b, respectively directly and via a multiplier by −1 referenced 89.

First summing circuits 84a and 84b receive firstly the product delivered by the first multiplier 82a and by the second multiplier 83a, and secondly the product delivered by the first multiplier 82b and the product delivered by the second multiplier 83b.

Second summing circuits are referenced 86a and 86b. Second summing circuit 86a receive the sum delivered by the first summing circuit 84a together with the same sum delayed by an N/2 value delay line 85a after inversion in an inverter referenced 861i. Similarly, the second summing circuit 86b receives the sum delivered by the first summing circuit 84b, together with the same sum delayed by N/2 values by a delay line 85b.

Third summing circuits are referenced 87a and 87b and they receive the sums delivered by the second summing circuits 86a and 86b respectively. The third summing circuit 87a also receives the value of the odd sample xN/2-1-2n after inversion by an inverter referenced 87li, while the third summing circuit 87b receives the value of the even sample x2n. The third summing circuits 87a and 87b thus deliver values corresponding to z'n, with the third summing circuits 87a delivering the real portions of z'n and with the third summing circuit 87b delivering the imaginary portions of z'n. It may be observed that the memories 88a and 88b may advantageously be constituted by RAM type memories each capable of storing N/4 values.

The module 3 for calculating the inverse fast Fourier transform FFT$^{-1}$ is identical to the module 3 in FIG. 4.

The module 9 for calculating the transform coefficients Yk then serves to calculate the values of the even coefficients Y2k and of the odd coefficients YN/2-2k-1 on the basis of the values of the above-mentioned fast Fourier transform.

As shown in FIG. 6, the module 9 comprises first multipliers referenced 91, 91b, 91c, and 91d. The first multipliers respectively receive the following: the real portion of the results of the fast Fourier transform written Re[Z'N/8-k]; the corresponding imaginary portion written Im[Z'N/8-k]; the real portion Re[Z'N/8+k]; and finally the corresponding imaginary portion Im[Z'N/8+k]. The abovementioned first multipliers also receive the above-mentioned value c from an auxiliary memory 90a.

The module 9 for calculating the transform coefficients further includes second multipliers respectively referenced 92a, 92b, 92c, and 92d. The second multipliers respectively receive the following: the products of the inverse fast Fourier transform in the same manner as the above-mentioned first multipliers, and also the above-mentioned value s from an auxiliary memory written 90b. The second multipliers deliver the corresponding products.

First summing circuits 93a, second summing circuits 93b, third summing circuits 93c, and fourth summing circuits 93d receive the values of the products of the first and second multipliers with and without inversion, respectively as follows: first multiplier 91a and second multiplier 92b; second multiplier 92a via an inverter 93b, and first multiplier 91b; first multiplier 91c and second multiplier 92d via an inverter 94c; and second multiplier 92c and first multiplier 91d. The sums delivered by the first and third summing circuits 93a and 93c are stored in an auxiliary memory 95a which constitutes a memory for the odd coefficients YN/2-2k-1 of the transform, while an auxiliary memory 95b receives the values delivered by the second and fourth summing circuits 93b and 93d, thereby storing the even coefficients Y2k of the transform.

It will thus be understood that the encoding module as shown in FIG. 6 enables a particularly advantageous gain in calculation time to be achieved since, as mentioned above, the number of operations is reduced from 3N operations to 2N operations, with a number of operations corresponding to those required for windowing in the embodiment of FIG. 4 thus being omitted.

It will naturally be observed that a decoder may be implemented using the same configuration as shown in FIG. 6 by applying the invertible transformation principle as already described with reference to FIGS. 4 and 5a. A detailed description of such a decoder is therefore not given since, in practice, it suffices merely to substitute the corresponding input and output variables, providing the procedure terminates with the series of multiplications by the above-mentioned rotation values c and s.

In an appendix to the present description, there follows a source code listing of a program for processing the samples x(n) both during encoding and during decoding. In the example given, the processing corresponds to that performed by the apparatus of FIG. 6. The above-mentioned source code program is written in the C language, together with comments in English.

| APPENDIX TO THE DESCRIPTION |
| --- |
| ```
/*      forward TDAC. declarations are omitted */
/*      *****initialisations***** */
        if(init ==0)
        {
        for (i = 0;i < N/4;i++)
        {
/*      Twiddle factors for the FFT (size N/4) */
        tw1[i] = cos(8.0*pi*(float)i/(float)N);
        tw2[i] = sin(8.0*pi*(float)i/(float)N);
/*      constants for the input and output rotations */
        theta = 2.0*pi*(4*(float)i+1)/(4.0*(float)N);
        cc[i] = cos(theta)*cos(theta);
        cs[i] = cos(theta)*sin(theta);
        }
        for (i=1;i<N/8+1;i++)
        {
        theta = 2.0*pi*(float)i/(float)N;
        wcos[i] = cos(theta);
        wsin[i] = sin(theta);
        }
        init = 1;
        }
/*      *****Fast Algorithm***** */
        for (i = 0;i < N/4;i++)
        {
        A = x[2*i]*cs[i] - x[N/2-1-2*i]*cc[i];
        B = x[2*i]*(1.0-cc[i]) - x[N/2-1-2*i]*cs[i];
        ycr[i] = memr[i] - x[N/2-1-2*i] - A;
        yci[i] = memi[i] + x[2*i] - B;
        memr[i] = A;
        memi[i] = B;
        }
        sign = -1;
        fft(ycr,yci,tw1,tw2,N/4,sign);
        for(k = 1;k < N/8 + 1;k++)
        {
        A = ycr[N/8-k];
        ycr[N/8-k] = A*wcos[k]+yci[N/8-k]*wsin[k];
        yci[N/8-k] = yci[N/8-k]*wcos[k]-A*wsin[k];
        A = ycr[N/8+k];
        ycr[N/8+k] = A*wcos[k]-yci[N/8+k]*wsin[k];
        yci[N/8+k] = yci[N/8+k]*wcos[k]+A*wsin[k];
        }
        for(k = 0;k < N/4;k++)
        {
        y[2*k] = -yci[k];
        y[N/2-2*k-1] = ycr[k];
        }
``` |

What is claimed is:

1. A method of transforming a digital signal (x) represented by digital samples x(n), said samples being lumped into blocks of N successive samples, wherein an encoding transformation comprises the steps of: space or time weighting of the samples as a function of a position n of each sample within the block such that:

$$yn = x(n).h(N-1-n)$$

where h(N-1-n) represents a determined weighting law; performing a modified discrete cosine transform on said weighted blocks of samples to calculate even order transformation coefficients:

$$Y2K = \sum_{n=0}^{N-1} yn \cdot \cos(2\pi/(4N)) \cdot (2n + 1) \cdot (4k + 1) + (4k + 1) \cdot \pi/4$$

for $k\delta$ with $YN\text{-}k=\text{-}Yk\text{-}1$ in which $(4k+1).\pi/4$ designates a phase shift term, said phase shift term being distributed as a function of an order k of a transformation coefficient under consideration;

converting said calculated even order coefficients Y2k into of an invertible complex transformation $$Y2k + N/4 + jY2k = (-1)^{k+1} \cdot W8^{-1} \cdot$$

$$\sum_{n=0}^{N/4-1} ((y'n - y''n + N/4) + j(y''n + y'n + N/4)) \cdot$$

$$W4N^{(4k+1)(4n+1)}$$

for $k=0, \ldots, N/4\text{-}1$ with $y'n = x2n.h2n$ $y''h = xN\text{-}2n\text{-}1.hN\text{-}2n\text{-}1$ $W4N = \cos(2\pi/4N) + j.\sin(2\pi/4N)$;

$W8 = W4N$ for $N=2$, and calculating said invertible complex transformation using an auxiliary calculation equation set forth below:

$$Zk = (-1)^{k+1} \cdot W8^{-1} \cdot W4N^{4k+1} \cdot \sum_{n=0}^{N/4-1} (zn \cdot WN^n) \cdot WN/4^{nk}$$

where:

$WN^n = \cos 2\pi n/N + j.\sin 2\pi n/N$ $zn = (y2n\text{-}yN/2\text{-}1\text{-}2n) + j(yN\text{-}1\text{-}2n + yN + 2 + 2n)$ for $n=0, \ldots, N/4\text{-}1$ designates a complex combination of particular weighted samples.

2. A method according to claim 1 wherein said step of calculating said invertible complex transform comprises the following successive steps:

a) calculating said complex combination of particular weighted samples zn for $n=0, \ldots, N/4\text{-}1$;

b) calculating multiplied complex combination values $z'n = zn.WN^n$ for $n=0, \ldots, N/4\text{-}1$;

c) calculating corresponding coefficients $Z'k$ by an inverse fast Fourier transform $FFT^{-1}$ of size N/4 applied on said multiplied complex combination values $z'n$, with:

$Z'k = FFT^{-1}.z'n$;

d) calculating an auxiliary equation $Zk = ((-1)^{k+1}.W8^{-1}.W4N^{+4k+1}).Z'k$ for $k=0, \ldots, N/4\text{-}1$;

e) successively determining even order transformation coefficients

| Y2k | Im[Zk] | as imaginary portion of Zk |
|---|---|---|
| Y2k+N/4 | Re[Zk] | as real portion of Zk; | f) transmitting said transformation coefficients Y2k, Y2k+N/4 in the form of a coded signal instead of the digital sample x(n) constituting said digital signals.

3. A method according to claim 2, wherein said auxiliary calculation equation being expressed as follows:

$$Zk = (-1)^{k+1} \cdot W8^{-1} \cdot WN^k \cdot \sum_{n=0}^{N/4-1} (zn \cdot W4N^{(4n+1)} \cdot WN/4^{nk})$$

steps b) and d) are interchanged, with complex multiplications by $W4N^{(4n+l)}$ being placed at the beginning or the end of the calculation.

4. A method of transforming a digital signal (x) represented by digital samples x(n), said samples being lumped into blocks of N samples, and being encoded according to claim 2, wherein a decoding transformation performed on said transmitted transform coefficient Y2kx, Y2k +N/4 comprises the steps of:

permutating the real and imaginary portions YN/4+2k, Y2k of said transmitted transformation coefficients;

subjecting said permutated coefficients to an encoding process by calculating a complex portion of a forward MDCT having portions Re, Im;

permutating real and imaginary portions of said complex portion; and performing an overlap calculation to reconstruct said samples x(n).

5. A method according to claim 4, wherein said encoding process of said coefficients includes forming a core of an inverse modified discrete cosine transform MDCT comprising the steps of:

calculating $z'n = zn.WN^n$ for $n=0, \ldots, N/4\text{-}1$;

calculating $Z'k$ by an inverse fast Fourier transform $FFT^{-1}$ of size N/4

$Z'k = FFT^{-1}.z'n$;

and calculating an expression $Zk = ((-1)^{k+1}.W8^{-1}.W4N^{4k+1}).Z'k$ for $k=0, \ldots, N/4\text{-}1$, as a value of said auxiliary equation, said process being identical to said encoding in which n and k are substituted so as to reestablish zn.

6. A method according to claim 5, wherein said inverse MDCT is calculated by means of a corresponding forward MDCT comprising the following steps of:

interchanging real and imaginary portions of the input signals, $z=a+jb==>z^*=b+ja$ to generate inverted input signals;

calculating a forward MDCT of said inverted input signals to generate output signals $Y^*k$ having real and imaginary portions; and interchanging said real and imaginary portions of said output signals $Y^*k$ to generate inverted output signals Yk.

7. Apparatus for encoding a digital signal (x) represented by digital samples x(n) lumped into blocks of N successive samples, said apparatus comprising:

first and second input memories each serving to store N/2 successive samples, said second input memory enabling said samples to be stored with a delay of N/2; and calculation means, for receiving weighted samples from a windowing operation on said samples stored in said first and second input memories which consists in performing space or time weighting of samples yn=x(n).h(N-1-n) where h(N-1-n) represents a determined weighting law, and for calculating an invertible complex transform using a modified discrete cosine transform MDCT to calculate even order transform coefficients $$Y2k = \sum_{n=0}^{N-1} yn \cdot \cos(2\pi/(4N)) \cdot (2n + 1) \cdot (4k + 1) + (4k + 1) \cdot \pi/4)$$

for $$k\delta$$

with YN-k=-Yk-1 in which $(4k+1).\pi/4$ designates a phase shift term, said phase shift term being distributed as a function of an order k of a transform coefficient under consideration, even order coefficients Y2k being obtained from said invertible complex transform Y2k+N/4+jY2k using an auxiliary calculation equation:

$$Zk = (-1)^{k+1} \cdot W8^{-1} \cdot W4N^{4k+1} \cdot \sum_{n=0}^{N/4-1} (zn \cdot WN^n) \cdot WN/4^{nk}$$

with W4N=cos2π/4N+jsin2π/4N

W8=W4N for N=2

$WN^n$=cos2πn/N+jsin2πn/N.

where:

zn=(y2n-yN/2-1-2n)+j(yN-1-2n+yN/2+2n)

for n=0, ..., N/4-1, designates a complex combination of particular weighted samples.

8. Apparatus according to claim 7, wherein said means for calculating said invertible complex transformation Y2K+N/4+jY2k comprises successively and in cascade:

first complex multiplication means for calculating said complex combination of particular weighted samples zn;

second complex multiplication means for calculating multiplied complex combination values z'n from said complex combination of particular weighted samples z'n=zn.$WN^n$ for n=0, ..., N/4-1;

inverse fast Fourier transform calculation means for calculating Z'k=FFT$^{-1}$.z'n, Z'k having real and imaginary portions; and third complex multiplication means for calculating the expression:

Zk=(-1)$^{k+1}$.W8$^{-1}$.W4N$^{4k+1}$.Z'k for k=0, ..., N/4-1 and for successively determining even order transformation coefficients:

| Y2k | Im[Zk] | imaginary portion of Zk |
|---|---|---|
| Y2k+N/4 | Re[Zk] | real portion of Zk. |

9. Apparatus according to claim 8, wherein said second complex multiplication means for calculating Z'n comprises:

memory means for storing constants $$WN^n = \cos2\pi \frac{n}{N} + j \cdot \sin2\pi \frac{n}{N} ;$$

a first multiplier receiving firstly a real portion of zn=a+jb and secondly a real portion $$\cos2\pi \frac{n}{N}$$

or an imaginary portion $$\sin2\pi \frac{n}{N}$$

of $WN^n$, and delivering corresponding products $$a \cdot \cos2\pi \frac{n}{N} \text{ and } a \cdot \sin2\pi \frac{n}{N} ;$$

a second multiplier receiving firstly an imaginary portion of zn=a+jb and secondly a real portion $$\cos2\pi \frac{n}{N}$$

or an imaginary portion $$\sin2\pi \frac{n}{N}$$

of $WN^n$, and delivering corresponding products $$b \cdot \cos2\pi \frac{n}{N} \text{ and } b \cdot \sin2\pi \frac{n}{N} ;$$

first summing means for receiving firstly from said first multiplier said product $$a \cdot \cos2\pi \frac{n}{N}$$

and secondly from said second multiplier said product $$b \cdot \sin2\pi \frac{n}{N}$$

via a multiplier by −1, and for delivering a real portion of z'n=a'+jb' with $$a' = a \cdot \cos2\pi \frac{n}{N} - b \cdot \sin2\pi \frac{n}{N} ;$$

second summing means for receiving firstly from said first multiplier said product $$a \cdot \sin 2\pi \frac{n}{N}$$

and secondly from said second multiplier said product $$b \cdot \cos 2\pi \frac{n}{N}$$

and for delivering an imaginary portion of $z'n = a' + jb'$ with $$b' = a \cdot \sin 2\pi \frac{n}{N} + b \cdot \cos 2\pi \frac{n}{N};\text{ and}$$

third and fourth auxiliary memories for storing said real and imaginary portions $a'$ and $b'$ respectively of $z'n$.

10. Apparatus according to claim 8, wherein said third complex multiplication means comprises:
means for storing real and imaginary portions of the constants $W8^{-1}$ and $W4N^{4k+1}$;
first multiplier means for receiving said real portion of said expression $Z'k$ including:
a third multiplier receiving said real portion of said constants $W8^{-1}$, $W4N^{4k+1}$ from said storing means, and
a fourth multiplier receiving said imaginary portion of said constants from said storing means;
second multiplier means receiving said imaginary portion of said expression $Z'k$ including:
a fifth multiplier receiving said real portion of said constants $W8^{-1}$ and $W4N^{4k+1}$ from said storing means, and
a sixth multiplier receiving said imaginary portion of said constants from said storing means;
third summing means for receiving firstly a product delivered by said third multiplier and secondly a product delivered by said sixth multiplier via a multiplier by $-1$, and for delivering a real portion for the expression of $Zk$ such that:

$Re = YN/4 + 2k$; and fourth summing means for receiving firstly a product delivered by said fourth multiplier and secondly a product delivered by said fifth multiplier, and for delivering an imaginary portion for the expression of $Zk$, such that:

$Im = Y2k$.

11. Apparatus for encoding and decoding a digital signal (x) represented by samples x(n) lumped into blocks of N successive samples, wherein said apparatus comprises:
first and second input memories storing odd and even samples $xN/2-1-2n$ and $x2n$ respectively;
first means for calculating by complex multiplication an equation forming a combination of particular values of said samples $z'n = ((x2n.c - xN/2-1-2n.s) + jzo^{-N/2}(x2n.s + xN/2-2n-1.c))(c + js)$ on the basis of even samples $x2n$ and odd samples $xN/2-1-2n$ where:

$$c = \cos 2\pi \frac{4n+1}{4N} \text{ and } s = \sin 2\pi \frac{4n+1}{4N};$$

$zo^{-N/2}$ designating a N/2 delay applied on a current order n sample,
first and second permanent memories storing the values of c and s respectively;
means for applying an inverse fast Fourier transform $FFT^{-1}$ to said combination of particular values of said samples $z'n$ to deliver the expressions $Z'(N/8-k) = FFT^{-1}.z'n$; and second calculation means for performing complex multiplication to calculate even $Y2k$ and odd $YN/2-2K-1$ transform coefficients.

12. Apparatus according to claim 11, wherein said first means for calculating by complex multiplication comprises:
a first multiplier receiving firstly said even samples $x2n$ from said second input memory and secondly, from said first permanent memory, said value c via a multiplier by $-1$;
a second multiplier receiving firstly said even samples from said second input memory and secondly, from said second permanent memory, said value s directly;
a third multiplier receiving firstly said odd samples from said first input memory and secondly, from said first permanent memory, said value c directly;
a fourth multiplier receiving firstly said odd samples from said first input memory and secondly, from said second permanent memory, said value s via a multiplier by $-1$;
first summing means for receiving products delivered by said first and second multipliers;
second summing means for receiving products delivered by said third and fourth multipliers;
third summing means for receiving firstly sums delivered by said first summing means directly and secondly sums delivered by said first summing means via a delay line having an inverter;
fourth summing means for receiving firstly sums delivered by said second summing means directly and secondly sums delivered by said second summing means via a delay line;
fifth summing means for receiving firstly said odd samples from said first input memory via an inverter and secondly sums delivered by said third summing means, said fifth summing means delivering the real portion of said combination of particular values of said samples $z'n$;
sixth summing means for directly receiving firstly said even samples from said second input memory and secondly sums delivered by said fourth summing means, said sixth summing means delivering the imaginary portion of said combination of particular values of said samples $z'n$; and
first and second RAM type memories respectively receiving said real and imaginary portions of said combination of particular values of said samples $z'n$.

13. Apparatus according to claim 12, further comprising:
a circuit for calculating an inverse fast Fourier transform $FFT^{-1}$, said circuit receiving said real and imaginary portions of said combination of particular values of samples z'n from said first and second RAM type memories; and wherein said second calculation means using complex multiplication to obtain even Y2k and odd YN/2-2k-1 transform coefficients comprises:

first multipliers receiving in order from said circuit for calculating $FFT^{-1}$: a real portion Re, an imaginary portion Im, a real portion Re, and an imaginary portion Im of the inverse fast Fourier transform of said combination of particular values of said samples z'n, $FFT^{-1}.z'n$ said first multipliers also receiving said value c from said first permanent memory;

second multipliers receiving in order from said circuit for calculating $FFT^{-1}$: said real portion Re, said imaginary portion Im, said real portion Re, and said imaginary portion Im of said inverse fast Fourier transform of said combination of particular values of said samples z'n, $FFT^{-1}.z'n$, said second multipliers also receiving said value s from said second permanent memory;

seventh, eighth, ninth and tenth summing means for respectively receiving products from corresponding first and second multipliers operating on same portions of said inverse fast Fourier transform as follows: directly from said first multiplier and from said second multiplier; from said second multiplier via an inverter and directly from said first multiplier; directly from said first multiplier and from said second multiplier via an inverter; and directly from said second multiplier and from said first multiplier; and first and second auxiliary memories respectively storing sums delivered by said first and second or by said third and fourth summing circuits, said stored sums corresponding to said odd coefficients YN/2-2k-1 and to said even Y2k transform coefficients, respectively.

14. Apparatus according to claim 8, wherein said first complex multiplication means for calculating zn comprises, connected to said first and second input memories;

first summing means receiving firstly, directly from said first input memory, a weighted sample value y2n of order 2n, and secondly, from said second input memory via a multiplier by $-1$, a weighted sample value yN/2-2-2n or order N/2-1-2n;

second summing means receiving firstly, from said first input memory, a weighted sample yN/2+2n of order N/2+2n and secondly, from said second input memory, a weighted sample yN-1-2n of order N-1-2n; and first and second auxiliary memories of capacity N/4 connected respectively to outputs of said first and second summing means and serving to store a real portion and an imaginary portion respectively of $zn = (y2n-yN/2-1-2n) + j(yN-1-2n+yN/2+2n)$.

15. Apparatus for decoding a digital signal (x) represented by digital samples x(n) lumped into blocks of N successive samples, said samples being encoded through an encoder by means of a modified discrete cosine transform MDCT, applied onto space or time weighted samples yn through a determined weighting law, to calculate even order MDCT transform coefficients $$Y2k = \sum_{n=0}^{N-1} yn \cdot \cos(2\pi/4N \cdot (2n+1) \cdot (4k+1) + (4k+1) \cdot \pi/4)$$

for kδ with YN-k=-Yk-1 in which $(4k+1)\pi/4$ designates a phase shift term which is distributed as a function of order k of a transform coefficient under consideration, said even order coefficients Y2k being obtained from said invertible complex transform Y2k+N/4+jY2k using a calculation equation $$Zk = (-1)^{k+1} \cdot W8^{-1} \cdot W4N^{4K+1} \cdot \sum_{n=0}^{N/4+1} (zn \cdot WN^n) \cdot WN/4^{nk}$$

where
W4N=cos(2π/4N)+j sin (2π/4N),
W8=W4N for N=2
zn=(y2n-yN/2-1-2n)+(j(yN-1-2n+yN/2+2n)
for n=0, ..., N/4-1 designates a complex combination of particular weighted samples, said calculation equation being obtained by calculating said complex combination of particular weighted samples zn for n=0, ..., N/4-1;
calculating multiplied complex combination values z'n=zn.WN$^n$ for n=0, ..., N/4-1 with WN$^n$=cos 2πn/N+j sin 2πn/N;
calculating corresponding coefficients Z'k by inverse fast Fourier transform $FET^{-1}.z'n$;
calculating an auxiliary equation $$Zk=((-1)^{k+1}.W8^{-1}.W4N^{4k+1}).Z'k;$$

ps so as to obtain said calculation equation, wherein said decoding apparatus comprises:
a memory storing said transmitted transformation coefficients YN/4+2k=Re and Y/2k=Im;
means for reading and permutating said stored transmitted transformation coefficients; and
means for calculating a complex portion of a forward MDCT transform, comprising successively and in cascade;
first complex multiplication means for reestablishing said complex combination values Z'k from said stored and permutated transformation coefficients,
means for calculating an inverse fast Fourier transform on said complex combination values z'n with $z'n = FFT^{-1}.Z'k$, and
second complex multiplication means for reestablishing said complex combination of particular weighted samples zn, expressed with its real and imaginary portions, from said calculation equation $$Zk = (-1)^{k+1} \cdot W8^{-1} \cdot W4N^{4k+1} \cdot \sum_{n=0}^{N/4-1} (zn \cdot WN^n) \cdot WN/4^{nk}$$

in which n and k are substituted so as to reestablish zn.

16. Apparatus according to claim 15, wherein said first complex multiplication means, said means for calculating an inverse Fourier transform and said second complex multiplication means are modules that are identical modules of said encoder further comprising means for reconstructing said samples x(n) from said real and imaginary portions of said complex combination of particular weighted samples zn.

* * * * *